United States Patent
Östlund et al.

(10) Patent No.: US 6,406,224 B1
(45) Date of Patent: *Jun. 18, 2002

(54) COATED MILLING INSERT

(75) Inventors: Åke Östlund, Hägersten; Jeanette Persson, Nacka; Rickard Sundström, Johanneshov, all of (SE)

(73) Assignee: Sandvik AB, Sandviken (SE)

( * ) Notice: Subject to any disclaimer, the term of this patent is extended or adjusted under 35 U.S.C. 154(b) by 77 days.

This patent is subject to a terminal disclaimer.

(21) Appl. No.: 09/652,028

(22) Filed: Aug. 31, 2000

(30) Foreign Application Priority Data

Sep. 1, 1999 (SE) .............................. 9903090

(51) Int. Cl.$^7$ ............................... B23B 27/14
(52) U.S. Cl. .................... 407/119; 407/118; 428/116
(58) Field of Search ................. 407/118, 119; 408/144, 145; 428/212, 216, 697, 699, 701, 702; 51/295, 307, 309

(56) References Cited

U.S. PATENT DOCUMENTS

| 4,539,251 A | * | 9/1985 | Sugisawa et al. ........... 428/216 |
| 4,587,174 A | * | 5/1986 | Yoshimura et al. ......... 428/552 |
| 5,674,564 A | | 10/1997 | Ljungberg et al. |
| 5,786,069 A | * | 7/1998 | Ljungberg et al. .......... 428/216 |
| 5,863,640 A | | 1/1999 | Ljungberg |
| 5,912,051 A | | 6/1999 | Olsson et al. |
| 5,945,207 A | * | 8/1999 | Kutscher et al. ............ 428/216 |
| 6,062,776 A | | 5/2000 | Sandman et al. |
| 6,177,178 B1 | * | 1/2001 | Ostlund ...................... 428/216 |
| 6,200,671 B1 | * | 3/2001 | Lindskog et al. ........... 428/216 |
| 6,207,262 B1 | * | 3/2001 | Ichikawa et al. ........... 428/216 |

FOREIGN PATENT DOCUMENTS

| EP | 617184 | 9/1994 |
| WO | 97/20081 | 6/1997 |

OTHER PUBLICATIONS

U.S. application No. 09/077,360, Östlund et al., filed Sep. 01, 1998.

* cited by examiner

Primary Examiner—Henry Tsai
(74) Attorney, Agent, or Firm—Burns, Doane, Swecker & Mathis, L.L.P.

(57) ABSTRACT

A coated milling insert particularly useful for milling in low and medium alloyed steels with or without abrasive surface zones during dry or wet conditions at high cutting speed, and milling hardened steels at high cutting speed. The insert is characterized by a WC-Co cemented carbide with a low content of cubic carbides and a highly W-alloyed binder phase and a coating including an innermost layer of $TiC_x$-$N_yO_z$ with columnar grains and a top layer of TiN and an inner layer of $\kappa$-$Al_2O_3$.

10 Claims, No Drawings

COATED MILLING INSERT

BACKGROUND OF THE INVENTION

1. Field of the Invention

The present invention relates to a coated cemented carbide cutting tool, such as an indexable insert, for milling. More particularly, to an insert useful for milling at high cutting speeds in low and medium alloyed steels or milling in hardened steels at high cutting speed, preferably at dry and rather stable conditions, but also for milling in cast iron and some of the stainless steels at high cutting speed.

2. Description of Related Art

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

It is well known that for cemented carbide cutting tools used in the machining of steels, the cutting edge is worn by different wear mechanisms such as chemical and abrasive wear but the tool edge may also fracture under a heavy intermittent cutting load, resulting in so called edge chipping which is usually initiated by cracks formed perpendicular to the cutting edge. These type of cracks are called comb cracks. Furthermore, different cutting conditions such as cutting speed, depth of cut, cutting feed rate and also external conditions such as dry or wet machining, vibrations of the work piece, or a surface zone from forging or casting on the work piece, or milling in hardened steels etc., require a plurality of different properties of the cutting edge.

For instance, when milling in a medium alloyed steel where the surface of the work piece material is covered by a so called surface skin-containing areas with high hardness which result from casting or forging, a coated cemented carbide insert must be used including a substrate of a tough cemented carbide grade having a wear resistant refractory surface coating. When applying a coated carbide cutting insert in milling of a workpiece of a low alloyed steel or a austenitic stainless steel at high cutting speeds, adhesive forces between the chips of the workpiece and the cutting edge will occur causing chipping along the cutting edge. In addition, when milling in ordinary low or medium alloyed steels at very high cutting speeds, the thermal energy developed in the cutting zone is considerable and the entire tool edge may plastically deform independent of the type of coating used. The meaning of high cutting speed is dependent of the properties of the work piece material and other factors related to the cutting operation. High cutting speed is the upper speed range that normally could be found at work shops. Furthermore when milling in hardened steels, hardened to at least 300 Brinell but often above 400–500 Brinell, the mechanical loads encountered normally reduces the tool life by fracture of the tool. When milling in hardened steels at high cutting speed, high mechanical load is encountered in combination with high temperature at the cutting zone, which normally reduces the tool life rather drastically.

Commercial cemented carbide tools for milling in steel, stainless steel or cast iron, at high cutting speeds are usually optimized with respect to one or two of the wear types observed.

U.S. Pat. No. 5,912,051 discloses a coated cutting insert particularly useful for dry milling of grey cast iron. U.S. Pat. No 5,863,640 discloses a coated turning insert particularly useful for intermittent turning in low alloyed steel.

In U.S. Pat. No. 6,062,776 a coated cemented carbide cutting tool particularly designed for the wet and dry milling of workpieces of low and medium alloyed steels or stainless steels, with or without abrasive surface zones, in machining operations requiring a high degree of toughness of the carbide cutting edge is described. The external cutting conditions are characterized by complex shapes of the workpiece, vibrations, chip hammering, recutting of the chips etc.

In WO 97/20081 a coated cemented carbide cutting tool particularly designed for the wet and dry milling of low and medium alloyed steels is described.

SUMMARY OF THE INVENTION

It has now surprisingly been found that by combining many different features a cutting tool can be obtained with excellent cutting performance in low and medium alloyed steels at high cutting speed, as well as milling in hardened steels at high cutting speed, in work piece materials with or without abrasive surface zones preferably under stable and dry conditions. It has also been found that this specific cutting tool also works in cast iron and stainless steel at high cutting speed. The cutting tool according to the invention shows improved properties with respect to the different wear types prevailing at these cutting conditions as earlier mentioned.

According to a first aspect, the present invention provides a cutting tool for milling low and medium alloyed steels with or without abrasive surfaces during dry or wet conditions at high cutting speed, and milling hardened steels at high cutting speed, comprising:

a cemented carbide body comprising WC, 7.1–7.9 wt-% Co and 0.2–1.8 wt-% cubic carbides of Ta, Ti and Nb, with Ti present on a level corresponding to a technical impurity, and a highly W-alloyed binder phase with a CW-ratio of 0.85–0.96: and a coating comprising:

a first innermost layer of $TiC_xN_yO_z$ with $x+y+z=1$, preferably $z<0.5$, with a thickness of 0.1–1.5 $\mu$m, and with equiaxed grains with a size $<0.5$ $\mu$m, a layer of $TiC_xN_yO_z$ with $x+y+z=1$, with $z=0$, $x>0.3$ and $y>0.3$, with a thickness of 1–6 $\mu$m, and with columnar grains with a diameter of about $<5$ $\mu$m, and a layer of a smooth, $\kappa$-$Al_2O_3$ with a grain size of 0.5–2 $\mu$m and with a thickness of 0.5–5 $\mu$m.

According to a further aspect, the present invention provides a method of making a cutting tool comprising a WC-Co-based cemented carbide body with a highly W-alloyed binder phase having a CW-ratio of 0.85–0.96, and a coating, the method comprising:

applying with a CVD technique, a first (innermost) layer of $C_xN_yO_z$ with $x+y+z=1$, $z<0.5$, with a thickness of 0.1–1.5 $\mu$m, with equiaxed grains with size $<0.5$ $\mu$m;

applying with a MTCVD-technique, using acetonitrile as the carbon and nitrogen source for forming the layer at a temperature range of 850–900° C., a layer of $TiC_xN_yO_z$ with $x+y+z=1$, $z=0$ and $x>0.3$ and $y>0.3$, with a thickness of 1–6 $\mu$m with columnar grains with a diameter of about $<5$ $\mu$m; and applying a layer of a smooth $\kappa$-$Al_2O_3$ with a thickness of 0.5–5 $\mu$m.

DETAILED DESCRIPTION OF THE INVENTION

The cutting tool insert according to the invention includes: a cemented carbide body with a rather high W-alloyed binder phase and with a well balanced chemical composition and grain size of the WC, a columnar TiC$_x$N$_y$O$_z$-layer, a κ-Al$_2$O$_3$-layer, a TiN-layer and optionally followed by smoothening the cutting edges by brushing, e.g.-brushing with a SiC-based brush.

According to the present invention a coated cutting tool insert is provided consisting of a cemented carbide body with a composition of 7.1–7.9 wt % Co, preferably 7.3–7.9 wt % Co, most preferably 7.4–7.8 wt % Co; 0.2–1.8 wt % cubic carbides, preferably 0.4–1.8 wt % cubic carbides, most preferably 0.5–1.7 wt % cubic carbides of the metals Ta, Nb and Ti; and balance is made up by WC. The cemented carbide may also contain other carbides from elements from group IVb, Vb or VIb of the periodic table. The content of Ti is preferably on a level corresponding to a technical impurity. The average grain size of the WC is in the range of about 1.5–2.2 μm, preferably about 1.8 μm.

The cobalt binder phase is rather highly alloyed with W. The content of W in the binder phase can be expressed as the CW-ratio=Ms/(wt % Co 0.0.0161), where Ms is the measured saturation magnetization of the cemented carbide body in kA/m and wt % Co is the weight percentage of Co in the cemented carbide. The CW-value is a function of the W content in the Co binder phase. A high CW-value corresponds to a low W-content in the binder phase.

It has now been found according to the present invention that improved cutting performance is achieved if the cemented carbide body has a CW-ratio of 0.85–0.96, preferably 0.86–0.94, and most preferably 0.86–0.93. The cemented carbide may contain small amounts, <1 volume %, of η-phase (M$_6$C), without any detrimental effect. From the CW-value it follows that no free graphite is allowed in the cemented carbide body according to the present invention.

The coating comprises:
- a first (innermost) layer of TiC$_x$N$_y$O$_z$ with x+y+z=1, preferably z<0.5, more preferably y>x and z<0.2, most preferably y>0.8 and z=0, with equiaxed grains with size <0.5 μm and a total thickness <1.5 μm and preferably >0.1 μm.
- a layer of TiC$_x$N$_y$O$_z$ with x+y+z=1, preferably with z=0, x>0.3 and y>0.3, most preferably x>0.5, with a thickness of 1–8 μm, preferably 2–7 μm, most preferably <6 μm, with columnar grains and with an average diameter of <5 μm, preferably 0.1–2 μm.
- a layer of a smooth, fine-grained (grain size about 0.5–2 μm) Al$_2$O$_3$ consisting essentially of the κ-phase. However, the layer may contain small amounts, 1–3 vol-%, of the θ- or the α-phases as determined by XRD-measurement. The Al$_2$O$_3$-layer has a thickness of 0.5–5 μm, preferably 0.5–2 μm, and most preferably 0.5–1.5 μm. The Al$_2$O$_3$ layer can be the outermost layer. However, preferably, this Al$_2$O$_3$-layer is followed by a further layer (<1 μm, preferably 0.1–0.5 μm thick) of TiC$_x$N$_y$O$_z$ with x+y+z=1, preferably with y>x and z<0.3, more preferably y>0.8, most preferably y=1. The outermost layer, Al$_2$O$_3$ (or TiC$_x$N$_y$O$_z$), has a surface roughness Rmax≦0.4 μm over a length of 10 μm. The TiC$_x$N$_y$O$_z$-layer, if present, is preferably removed along the cutting edge. Alternatively, the TiC$_x$N$_y$O$_z$ layer is removed and the underlying alumina layer is partly or completely removed along the cutting edge.

The present invention also relates to a method of making a coated cutting tool insert consisting of a cemented carbide body with a composition of 7.1–7.9 wt % Co, preferably 7.3–7.9 wt % Co, most preferably 7.4–7.8 wt % Co; 0.2–1.8 wt % cubic carbides, preferably 0.4–1.8 wt % cubic carbides, most preferably 0.5–1.7 wt % cubic carbides of the metals Ta, Nb and Ti; and the balance WC. The cemented carbide may also contain other carbides from elements from group IVb, Vb or VIb of the periodic table. The content of Ti is preferably on a level corresponding to a technical impurity. The average grain size of the WC is in the range of about 1.5–2.5 μm, preferably about 1.8 μm. Onto the cemented carbide body is deposited:
- a first (innermost) layer of TiC$_x$N$_y$O$_z$ with x+y+z=1, preferably z<0.5, more preferably y>x and z<0.2, most preferably y>0.8 and z=0, with equiaxed grains with size <0.5 μm and a total thickness <1.5 μm, and preferably >0.1 μm, using known CVD-methods.
- a layer of TiC$_x$N$_y$O$_z$ with x+y+z=1, preferably with z=0, x>0.3 and y >0.3, most preferably x>0.5, with a thickness of 1–8 μm, preferably 2–7 μm, most preferably <6 μm, with columnar grains and with an average diameter of about <5 μm, preferably 0.1–2 μm, using preferably MTCVD-technique (using acetonitrile as the carbon and nitrogen source for forming the layer in the temperature range of 700–900° C.). The exact conditions, however, depend to a certain extent on the design of the equipment used.
- a smooth Al$_2$O$_3$-layer essentially consisting of κ-Al$_2$O$_3$ is deposited under conditions disclosed in e.g. U.S. Pat. No 5,674,564. The Al$_2$O$_3$ layer has a thickness of 0.5–5 μm, preferably 0.5–2 μm μm, and most preferably 0.5–1.5 μm. Preferably, a further layer (<1 μm, preferably 0.1–0.5 μm thick) of TiC$_x$N$_y$O$_z$ is deposited, but the Al$_2$O$_3$-layer can be the outermost layer. This outermost layer, Al$_2$O$_3$ or TiC$_x$N$_y$O$_z$, has a surface roughness Rmax≦0.4 μm over a length of 10 μm. The smooth coating surface can be obtained by a gentle wet-blasting the coating surface with fine grained (400–150 mesh) alumina powder or by brushing (preferably used when TiC$_x$N$_y$O$_z$ top coating is present) the edges with brushes based on, e.g.-SiC as disclosed e.g. in U.S. Pat. No. 5,861,210. The TiC$_x$N$_y$O$_z$-layer, if present, is preferably removed along the cutting edge. Alternatively, the TiC$_x$N$_y$O$_z$ layer is removed and the underlying alumina layer is partly or completely removed along the cutting edge.

The present invention will now be further described by reference to the following examples, which are intended to be illustrative rather restrictive.

EXAMPLE 1

A.) A cemented carbide milling tool in accordance with the invention with the composition 7.6 wt-% Co, 1.22 wt-% TaC, 0.30 wt-% NbC and balance is made up by WC, with a binder phase alloyed with W corresponding to a CW-ratio of 0.87 were coated with a 0.5 μm equiaxed TiC$_{0.05}$N$_{0.95}$-layer (with a high nitrogen content corresponding to an estimated C/N-ratio of 0.05) followed by a 4 μm thick TiC$_{0.54}$N$_{0.46}$-layer, with columnar grains by using MTCVD-technique (temperature 885–850° C. and CH$_3$CN as the carbon/nitrogen source). In subsequent steps during the same coating cycle, a 1.0 μm thick layer of Al$_2$O$_3$ was deposited using a temperature 970° C. and a concentration of H$_2$S dopant of 0.4% as disclosed in U.S. Pat. No 5,674, 564. A thin (0.3 μm) layer of TiN was deposited on top according to known CVD-technique. XRD-measurement showed that the Al$_2$O$_3$-layer consisted of 100% κ-phase. The cemented carbide body had a WC grain size in average of 1.7 μm.

B.) A cemented carbide milling tool with the composition 9.1 wt-% Co, 1.25 wt-% TaC, 0.30 wt % NbC and the balance is made up by WC, with a binder phase alloyed with W corresponding ponding to a CW-ratio of 0.90. The cemented carbide body had a WC grain size in average of 1.7 µm, and a similar coating compared to the coating on A, but the thickness of the $Al_2O_3$-layer was 1.2 µm.

C.) A cemented carbide milling tool with the composition 6.0 wt-% Co, and the balance is made up by WC, with a binder phase alloyed with W corresponding to a CW-ratio of 0.90, and a WC grain size is 1.8 µm. The coating is similar to the coating on A, but the thickness of the $Al_2O_3$-layer was 4.1 µm and this layer is the outermost layer.

| | |
|---|---|
| Operation: | Face milling - semi finishing |
| Work-piece: | Support ring |
| Material: | SS 2242, hardened to 51 HRC |
| Cutting speed: | 100 m/min |
| Feed rate/tooth: | 0.09 mm/rev. |
| Depth of cut: | 0.3–3.5 mm |
| Insert-style: | RCKT 1606MO |
| Cutter-body: | R200-084Q32-16M |
| Note: | six inserts, dry and stable conditions |
| Results: | Tool-life, (average value after three tests per variant) min: |
| Grade A: | 24 |
| Grade B (conv. art): | 12 |
| Grade C (conv. art): | 14 |

Tool-life critreia were fracture on rake face of the inserts, and flank wear.

EXAMPLE 2

D.) A cemented carbide milling tool in accordance with the invention with the composition 7.2 wt-% Co, 1.24 wt-% TaC, 0.29 wt-% NbC and balance WC, with a binder phase alloyed with CW-ratio of 0.92 were coated with a 0.5 µm equiaxed $TiC_{0.05}N_{0.95}$-layer (with a high nitrogen content corresponding to an estimated C/N-ratio of 0.05) followed by a 5 µm thick $TiC_{0.54}N_{0.46}$-layer, with columnar grains by using MTCVD-technique (temperature 885–850° C. and $CH_3CN$ as the carbon/nitrogen source). In subsequent steps during the same coating cycle, a 1.5 µm thick layer of $Al_2O_3$ was deposited using a temperature 970° C. and a concentration of $H_2S$ dopant of 0.4% as disclosed in U.S. Pat. No 5,674,564. A thin (0.3 µm) layer of TiN was deposited on top according to known CVD-technique. XRD-measurement showed that the $Al_2O_3$-layer consisted of 100% κ-phase. The cemented carbide body had a WC grain size in average of 1.8 µm.

E. A commercial cemented carbide cutting tool with the composition of 8.0 wt-% Co, 0.2 wt-% TiC, 1.8 wt-% TaC, 0.2 wt-% NbC, and balance is made up by WC, and CW-ratio of 0.85. The WC-grain size was 1.7 µm. The insert had a conventional CVD-coating consisting of total 4 µm TiC/TiC,N/TiN.

Inserts from B, D and E were tested in a face milling operation.

| | |
|---|---|
| Operation: | Face milling (4 passages per 200 mm) |
| Work-piece: | Bar, 300 × 200 mm |
| Material: | SS2541, HB = 300 |
| Cutting speed: | 367 m/min |
| Feed rate/tooth: | 0.15 mm/rev. |
| Depth of cut: | 2 mm |
| Insert-style: | SEKN 1204 |

-continued

| | |
|---|---|
| Note: | 6 inserts, dry and stable condition |
| Results: | Tool-life, milled length m, average of two tests |
| Grade D: | 9.0 |
| Grade B (conv. art): | 7.8 |
| Grade E (conv. art): | 5.7 |

Tool-life criteria were flank wear and chipping between comb cracks

EXAMPLE 3

Inserts from B and A were tested in face milling

| | |
|---|---|
| Operation: | Face milling - semi finishing |
| Work-piece: | Axle housing |
| Material: | cast steel low alloyed, HB = 280 |
| Cutting speed: | 228 m/min |
| Feed rate/tooth: | 0.24 mm/rev. |
| Depth of cut: | 1.3–3.2 mm |
| Insert-style: | LNCX 1806AZ R-11 |
| Note: | dry, 10 teeth, unstable tendencies |
| Results: | Tool-life, number of component per edge set |
| Grade A: | 5 |
| Grade B: (conv. art) | 1 |

Tool-life criterion was flank wear and plastic deformation.

EXAMPLE 4

| | | |
|---|---|---|
| Operation: | Face milling - roughing | |
| Work-piece: | Plate, 300 × 220 mm | |
| Material: | 1.2767, machined surface with holes, 54 HRC | |
| Cutting speed: | 67 m/min | |
| Feed rate/tooth: | 0.27 mm/rev. | |
| Depth of cut: | 1 mm | |
| Insert-style: | RCKT 1204 | |
| Note: | dry, 6 teeth, instability | |
| Results: | Tool-life, no of passages, min | |
| Grade A: | 18 | 13.5 |
| Grade C (conv. art): | 8 | 6 |

Inserts from A and C were tested in face milling in a hardened plate with holes.

Tool-life criterion was flank wear and plastic deformation

EXAMPLE 5

F. A cemented carbide milling tool in accordance with the invention with the composition 7.2 wt-% Co, 1.24 wt-% TaC, 0.29 wt-% NbC and balance is made up by WC, with a binder phase alloyed with W corresponding to a CW-ratio of 0.89 were coated with a 0.5 µm equiaxed $TiC_{0.05}N_{0.95}$-layer (with a high nitrogen content corresponding to an estimated C/N-ratio of 0.05) followed by a 4 µm thick $TiC_{0.54}N_{0.46}$-layer, with columnar grains by using MTCVD-technique (temperature 885–850° C. and $CH_3CN$ as the carbon/nitrogen source). In subsequent steps during the same coating cycle, a 1.0 µm thick layer of $Al_2O_3$ was deposited using a temperature 970° C. and a concentration of $H_2S$ dopant of 0.4% as disclosed in U.S. Pat. No 5,674,564. A thin (0.3 µm) layer of TiN was deposited on top according to known CVD-technique. XRD-measurement showed that the $Al_2O_3$-layer consisted of 100% κ-phase. The cemented carbide body had a WC grain size in average of 1.75 µm.

Inserts from F and B were tested in a face milling operation. A cutter body with a diameter of 160 mm were central positioned relatively a rod with a diameter of 90 mm.

| | |
|---|---|
| Operation: | Face milling |
| Work-piece: | SS2541 diameter 90 mm, HB = 310 |
| Cutting speed: | 372 m/min |
| Feed rate/tooth: | 0.32 mm/rev. |
| Depth of cut: | 2 mm |
| Insert-style: | R245 12T3E-PL |
| Note: | dry, one tooth |
| Results: | Tool-life, (average 2 tests) min: |
| Grade F: | 13 |
| Grade B(conv. art): | 9.5 |

Tool-life criterion was chipping due to comb crack formation.

EXAMPLE 6

Inserts from A and B were tested in cavity milling with round inserts.

| | |
|---|---|
| Operation: | Cavity milling including ramping |
| Work-piece: | Orvar Supreme 41 HRC (AISI Prem.H13), 220 × 250 mm |
| Cutting speed: | 175 m/min |
| Feed rate/tooth: | 0.20 mm/rev. |
| Depth of cut: | 2 mm |
| Insert style: | RCKT 1204 |
| Note: | dry, some instability |
| Results: | Tool-life, (average two tests) min: |
| Grade A: | 60 |
| Grade B(conv. art): | 21 |

Tool-life criterion was chipping due to comb crack formation.

EXAMPLE 7

G. A commercial cemented carbide cutting tool with the composition of 7.0 wt-% Co, 0.1 wt-% TiC, 0.7 wt-% TaC, 0.1 wt-% NbC, and balance is made up by WC and CW-ratio of 0.90. The WC-grain size was 2.6 $\mu$m. The insert were coated with a 0.3 $\mu$m TiN-layer followed by a 0.8 $\mu$m thick $Al_2O_3$-layer, followed by a 0.5 $\mu$m TiN-layer followed by a 4.3 $\mu$m TiC,N-layer by using MTCVD-technique and finally followed by a 0.2 $\mu$m TiN-layer.

Inserts from A, B and G were tested in cavity milling with round inserts.

| | |
|---|---|
| Operation: | Cavity milling including ramping |
| Work-piece: | Ni max,7 hardened to 390 HB,220 × 250 mm |
| Cutting speed: | 250 m/min |
| Feed rate/tooth: | 0.27 mm/rev. |
| Depth of cut: | 2 mm |
| Insert-style: | RCKT 1204 and RPMT 1204 |
| Note: | dry, some instability |
| Results: | Tool-life, min: |
| Grade A: | 55.4 |
| Grade B(conv. art): | 32.0 |
| Grade G(conv. art): | 14.9 |

Tool-life criterion was chipping due to comb crack formation.

While the present invention has been described by reference to the above-mentioned embodiments, certain modifications and variations will be evident to those of ordinary skill in the art. Therefore the present invention is to limited only by the scope and spirit of the appended claims.

We claim:

1. A cutting tool for milling low and medium alloyed steels with or without abrasive surfaces during dry or wet conditions at high cutting speed, and milling hardened steels at high cutting speed, comprising:

a cemented carbide body comprising WC, 7.1–7.9 wt-% Co and 0.2–1.8 wt-% cubic carbides of Ta, Ti and Nb, with Ti present on a level corresponding to a technical impurity, and a highly W-alloyed binder phase with a CW-ratio of 0.85–0.96: and a coating comprising:
   a first innermost layer of $TiC_xN_yO_z$ with x+y+z=1, z<0.5, with a thickness of 0.1–1.5 $\mu$m, and with equiaxed grains with a size <0.5 $\mu$m,
   a layer of $TiC_xN_yO_z$ with x+y+z=1, with z=0, x>0.3 and y>0.3, with a thickness of 1–8 $\mu$m, and with columnar grains with a diameter of about <5 $\mu$m, and
   a layer of a smooth, $\kappa$-$Al_2O_3$ with a grain size of 0.5–2 $\mu$m and with a thickness of 0.5–5 $\mu$m.

2. The tool according to claim 1 wherein the cemented carbide body has a composition comprising 7.4–7.8 wt-% Co and 0.4–1.8 wt % carbides of Ta and Nb.

3. The tool according to claim 1 further comprising a CW-ratio of 0.86–0.93.

4. The tool according to claim 1 further comprising an outermost TiN-layer.

5. The tool according to claim 4, wherein the outermost TiN layer has been removed at least along a cutting edge of the tool.

6. A method of making a cutting tool comprising a WC-Co-based cemented carbide body with a highly W-alloyed binder phase having a CW-ratio of 0.85–0.96, and a coating, the method comprising:

applying with a CVD technique, a first (innermost) layer of $TiC_xN_yO_z$ with x+y+z=1, z<0.5, with a thickness of 0.1–1.5 $\mu$m, with equiaxed grains with size <0.5 $\mu$m;

applying with a MTCVD-technique, using acetonitrile as the carbon and nitrogen source for forming the layer at a temperature range of 850–900° C., a layer of $TiC_xN_yO_z$ with x+y+z=1, z=0 and x>0.3 and y >0.3, with a thickness of 1–8 $\mu$m with columnar grains with a diameter of about <5 $\mu$m; and applying a layer of a smooth $\kappa$-$Al_2O_3$ with a thickness of 0.5–5 $\mu$m.

7. The method according to the claim 6 wherein said cemented carbide body has a cobalt content of 7.4–7.8 wt % and 0.4–1.8 wt % cubic carbides of Ta and Nb.

8. The method according to claim 6 wherein the cemented carbide body comprises a CW-ratio of 0.86–0.93.

9. The method according to claim 5 further comprising applying an outermost TiN-layer.to the body.

10. The method of claim 9 further comprising removing the outermost TiN layer at least along a cutting edge of the tool.

* * * * *